US006550570B2

(12) United States Patent
Combest

(10) Patent No.: US 6,550,570 B2
(45) Date of Patent: Apr. 22, 2003

(54) SPEAKER ENCLOSURE AND MOUNTING METHOD FOR ISOLATING AND INSULATING FACEPLATE AND SPEAKERS FROM A SURROUNDING MOUNTING SURFACE

(75) Inventor: Christopher E. Combest, Leawood, KS (US)

(73) Assignee: Multi Service Corporation, Overland Park, KS (US)

( * ) Notice: Subject to any disclaimer, the term of this patent is extended or adjusted under 35 U.S.C. 154(b) by 117 days.

(21) Appl. No.: 09/760,986

(22) Filed: Jan. 16, 2001

(65) Prior Publication Data

US 2002/0092702 A1 Jul. 18, 2002

(51) Int. Cl.[7] .................. H05K 5/00

(52) U.S. Cl. .................. 181/150; 181/199; 381/345; 381/152

(58) Field of Search .................. 181/150, 199, 181/207, 148; 381/345, 188, 152, 205, 353, 354

(56) References Cited

U.S. PATENT DOCUMENTS

| | | | | | |
|---|---|---|---|---|---|
| 3,892,289 | A | * | 7/1975 | Rollins | 181/171 |
| D244,877 | S | | 6/1977 | McLaughlin | |
| 4,027,644 | A | * | 6/1977 | Timour | 181/204 |
| 4,066,058 | A | * | 1/1978 | Anderkay | 181/207 |
| 4,296,280 | A | | 10/1981 | Richie | |
| 4,598,178 | A | * | 7/1986 | Rollins | 381/354 |
| 4,640,381 | A | | 2/1987 | Tsuchiya et al. | |
| 4,740,336 | A | * | 4/1988 | Connen et al. | 264/295 |
| D307,761 | S | | 5/1990 | Ryan | |
| 4,991,352 | A | * | 2/1991 | Hyer | 49/489.1 |
| 5,082,083 | A | | 1/1992 | Draffen | |
| 5,292,092 | A | | 3/1994 | Curtis et al. | |
| 5,299,766 | A | | 4/1994 | Curtis et al. | |
| 5,310,149 | A | | 5/1994 | Struthers et al. | |
| 5,322,979 | A | * | 6/1994 | Cassity et al. | 181/150 |
| 5,330,144 | A | | 7/1994 | Stevenson et al. | |
| 5,388,795 | A | | 2/1995 | Struthers et al. | |
| 5,400,412 | A | | 3/1995 | King, Sr. et al. | |
| 5,423,500 | A | | 6/1995 | Struthers et al. | |
| 5,739,481 | A | * | 4/1998 | Baumhauer et al. | 181/148 |
| 6,354,397 | B1 | * | 3/2002 | Combest et al. | 181/141 |
| 6,360,842 | B1 | * | 3/2002 | Combest | 181/150 |

FOREIGN PATENT DOCUMENTS

| | | |
|---|---|---|
| JP | 59215195 | 12/1984 |
| JP | 60200697 | 10/1985 |

* cited by examiner

*Primary Examiner*—Robert E. Nappi
*Assistant Examiner*—Edgardo San Martin
(74) *Attorney, Agent, or Firm*—Hovey Williams LLP

(57) ABSTRACT

A speaker enclosure (10) comprising a speaker box (12) having an opening (27) and adapted for mounting within a wall (20) upon a wall stud (22); a compressible gasket (14) affixed about the box opening (27); a faceplate (16); and a plurality of independently adjustable coupling mechanisms (18) for coupling the faceplate (16) with the box (12). The uncompressed gasket (14) protrudes beyond the wall surface (26) until the faceplate (16) is brought into contact with and compresses the gasket (14) by the coupling mechanisms (18) which may be independently adjusted to provide an optimum and substantially uniform degree of separation between faceplate (16) and wall (20), thereby reducing distortion, vibration, and damage due to undesirable contact therebetween.

3 Claims, 2 Drawing Sheets

SPEAKER ENCLOSURE AND MOUNTING METHOD FOR ISOLATING AND INSULATING FACEPLATE AND SPEAKERS FROM A SURROUNDING MOUNTING SURFACE

BACKGROUND OF THE INVENTION

1. Field of the Invention

The present invention relates to speaker enclosures or cabinets recessedly mounted beneath a surface or within a structure. More particularly, the invention relates to a speaker enclosure adapted for in-wall mounting and having a suspending or isolating and insulating gasket providing an optimum or desirable degree of separation between the enclosure faceplate and the wall in which the enclosure is mounted so as to prevent sound distortion and wall damage due to improper installation or vibrations.

2. Description of the Prior Art

Those with skill in the art of home theater systems and speaker enclosures or cabinets will appreciate that a number of strategically placed speakers are often desirable in order to produce the best sound. This is true, for example, in home theater systems employing left and right main, left and right surround, center, and sub-woofer speaker groupings, with each such grouping typically comprising a variety of individual specialized speakers, such as high-range "tweeters", mid-rangers, and low-range "woofers". Often, it is desirable that at least some of the speakers be placed upon shelves or otherwise raised so as to minimize sound absorption and interference, tripping hazards, and aesthetic disappear associated with floor-placed speakers. As will also be appreciated, speaker sound quality is directly related to the weight of the speaker magnet, thus many audiophiles insist on increasingly heavier speakers.

A well-known solution to strategic and aesthetic speaker placement is wall-or ceiling-mounting by cutting holes in drywall, wallboard, or other building material to receive and hold each individual speaker. Unfortunately, the speakers are typically mounted upon or in contact with the drywall, resulting in drywall cracks or other failure due to vibrations transmitted by the operational speakers. Furthermore, direct speaker-to-drywall contact can result in absorption, interference, or other undesirable sound distortion.

Another solution is to place the speakers within an enclosure and mount the enclosure to the wall or ceiling. Such enclosures are typically designed to enhance speaker performance by minimizing unwanted vibrations and optimizing air flow to the speakers. Unfortunately, an enclosure and its speakers, weighing a combined thirty or more pounds, can cause the mounting surface to bow or fail, again resulting in drywall cracks or failure and possibly allowing the enclosure to fall. This is of particular concern where relatively thin drywall or other building materials have been used to save costs. Furthermore, adjacent wall and ceiling structures can cause undesirable sound distortion or vibrations and are subject to damage when transmitted speaker-generated vibrations reach certain magnitudes or frequencies. Such vibration can also lead to a loosening and separation of the enclosure mount from the mounting surface.

Some of the above-described problems can be solved by mounting speaker enclosures within walls or ceilings rather than to their surfaces. That is, rear and side portions of an enclosure are recessed within the wall, and preferably coupled with one or more wall studs, so that only a flush-mounted faceplate protrudes and is seen, with the speakers being mounted to an interior surface of the faceplate. Unfortunately, though the enclosure may be mounted to wall studs, contact between the faceplate and drywall can still cause bowing, cracking or failure thereof, particularly where the faceplate is over tightened thereupon during installation. Furthermore, even though the faceplate does not depend directly from the drywall, speaker vibrations can still be transmitted from the enclosure via the mounting studs to the drywall, which, again, may cause cracking, sound distortion, or other undesirable effects.

Due to the above-identified and other problems in the art, a need exists for an improved speaker enclosure and mounting method.

SUMMARY OF THE INVENTION

The speaker enclosure of the present invention overcomes the above-identified and other problems in the art to provide a simple and inexpensive enclosure and mounting method for suspending or isolating and insulating the faceplate and speakers from the mounting wall, thereby reducing distortion, vibration, and damage due to undesirable contact and transmission of speaker vibrations. Specifically, the present invention comprises a speaker enclosure adapted for in-wall mounting and having a heavy duty compressible rubber gasket, preferably including a collapsible tubular air chamber or pocket, interposed between faceplate and speaker box to prevent overtightening of the faceplate to the drywall and thereby provide an optimum or desirable degree of contact separation and sound insulation.

The preferred enclosure comprises a speaker box presenting an access opening and adapted for mounting upon one or more wall studs and dimensioned so as to fit between exterior and interior wall surfaces; an isolating and insulating gasket affixed about a perimeter of the box opening; a faceplate to which the speakers are mounted; and a plurality of independently adjustable threaded coupling mechanisms for coupling the faceplate with the box. The speaker box is mounted so that the uncompressed gasket protrudes beyond the drywall surface, and provides, when compressed, an optimum or desired degree of separation between faceplate and drywall. The insulating gasket is further able to absorb speaker-generated vibrations that might otherwise be transmitted via the wall studs to cause sound distortion or damage the drywall.

These and other important aspects of the present invention are more fully described in the section entitled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figures 1, 2:
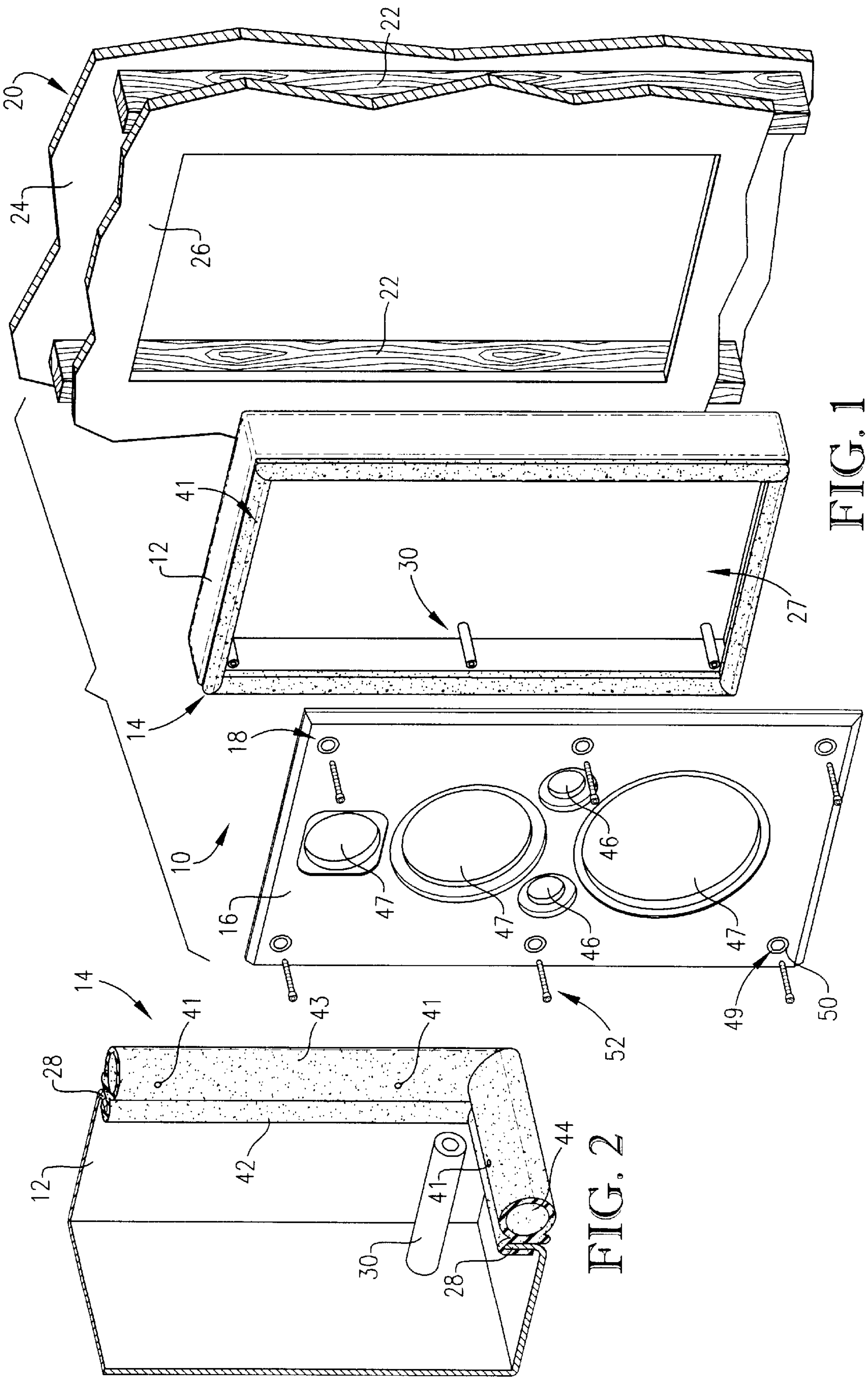
FIG. 1 is exploded isometric view of a preferred embodiment of the speaker enclosure of the present invention.
FIG. 2 is a fragmentary sectional view of a portion of the preferred speaker enclosure shown in FIG. 1.

Referring to FIG. 1, a speaker enclosure 10 is shown constructed in accordance with a preferred embodiment of the present invention, and broadly comprising a speaker box 12; a gasket 14; a faceplate 16; and a plurality of independently adjustable coupling mechanisms 18. As described in more detail below, the speaker enclosure 10 is operable to securely mount one or more speakers (not shown) within a wall 20, achieve an optimum degree of separation between the faceplate 16 of the enclosure 10 and a drywall surface 26 of the mounting wall 20, and to insulate from transmitted speaker vibrations one or more wall studs 22 from which the enclosure 10 depends. Although illustrated as being mounted within a wall, the speaker box portion 12 of the enclosure 10 may be mounted beneath any suitable surface or within any suitable structure, including ceilings or floors.

The speaker box 12 protectively houses the speakers within the wall 20 and provides a mounting surface and mechanism for coupling the enclosure 10 with one or more wall studs 22. The speaker box 12 is preferably constructed of metal, having a top, bottom, sides, back, and a speaker opening 27, and is dimensioned so as to enclose a desired number and size of speakers while fitting between adjacent wall studs 22 and between wall sheathing 24 and interior drywall surfaces 26. The speaker box 12 may be mounted to the wall studs 22 in any conventional manner; however, a preferred manner of mounting is described in detail in pending application titled "In-Wall Speaker Mounting Apparatus", Ser. No. 09/515,810, filed Feb. 29, 2000, hereby incorporated by reference as though set forth in the present application.

As is best illustrated in FIG. 2, the speaker box 12 presents a circumferential lip 28 extending about the speaker opening 27. The speaker box 12 further includes substantially hollow mounting pylons 30 having female receiving threads and secured to and projecting from the back portion of the box 12. These pylons 30 form a part of the coupling mechanisms 18, which are described in more detail below.

Figure 4:
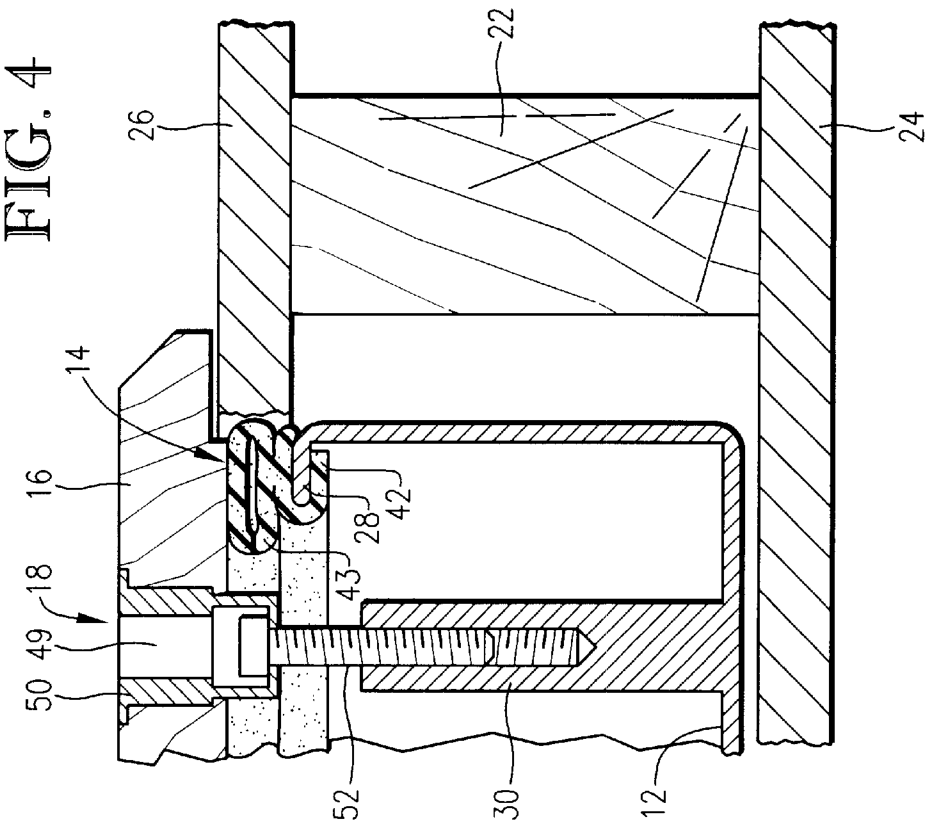
FIG. 4 is a fragmentary sectional view of the preferred speaker enclosure of FIG. 1 wherein the faceplate is in a final mounting position with the isolating and insulating gasket compressed to provide the optimum degree of separation between faceplate and wall board.
Figure 3:
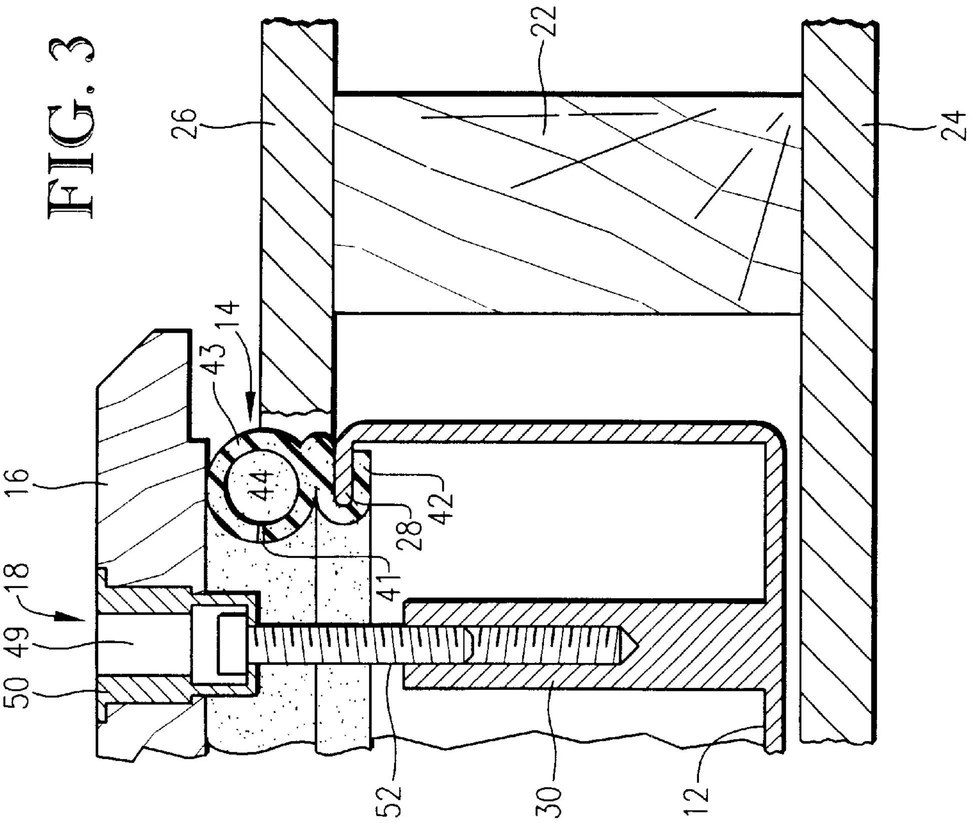
FIG. 3 is a fragmentary sectional view of the preferred speaker enclosure of FIG. 1 wherein the faceplate is in an initial mounting position with the isolating and insulating gasket uncompressed.

Referring also to FIGS. 3 and 4, the gasket 14 operates to suspend or isolate the faceplate 16 from the drywall 26 by ensuring optimum separation therebetween, and to insulate the studs 22 from transmitted speaker vibrations. The gasket 14 is preferably heavy duty, being made of rubber or similar material, and preferably includes a tubular portion 43, having an outside diameter of approximately one-half inch, defining continuous and a collapsible air pocket 44 for maintaining isolative and insulative qualities even while under compression. The pocket 44 is collapsible due to a plurality of spaced apart air holes 41 for allowing air to escape the pocket 44 as the gasket 14 is compressed and to reenter the pocket 44 as compression is relieved. The gasket 14 also presents a channel 42 for receiving and clamping or crimping upon the box lip 28. Alternatively or additionally, adhesives may be used as needed or desired to permanently or removably secure the gasket 14 to the lip 28.

An exemplary gasket is used in many automobiles to seal doors or hatches. This type of gasket is suitable because of its heavy duty, wear resistant nature and its relatively large size. A larger-sized gasket, particularly a larger tubular portion 43, allows for both attachment to the recessed speaker box 12 and sufficient protrusion (approximately one-quarter inch) beyond the drywall surface 26 (assume standard half-inch drywall thickness) to compress under pressure of the installed faceplate 16 while leaving an optimum degree of isolating separation between drywall 26 and faceplate 16.

The faceplate 16, once installed over the speaker opening 27 of the box 12, completes the enclosure 10. The faceplate 16 is preferably made of an aesthetically pleasing material, such as wood, and is provided with air ports 46 and speaker holes 47 through which individual speakers (not shown), including tweeters, mid-rangers, and woofers, can be mounted. The number and size of these ports and holes 46, 47 is design dependent. The faceplate 16 is also provided with a plurality of holes 49 for accommodating the coupling mechanisms 18, the exact number of which depends upon the size of the faceplate 16, as described below.

The coupling mechanisms 18 secure the faceplate 16 to the box 12. Each coupling mechanism 18 is independently adjustable, comprising a sleeve 50; a bolt 52; and the mounting pylons 30 described above. The sleeve 50 fits into the hole 49 in the faceplate 16 and slidably receives the bolt, thereby aesthetically minimizing the bolt appearance and eliminating unsightly protrusion of the bolthead above the faceplate surface. The bolt 52 is conventional and threadably received within the mounting pylon 30. It is contemplated that in some embodiments a travel limiting stop may be provided to prevent overtightening the faceplate 16 to the box 12.

Because the coupling mechanisms 18 are independently adjustable and arranged about the perimeter of the faceplate 14, a substantially uniform degree of separation may be obtained, regardless of faceplate 16 or wall 22 irregularities, or non-flush or otherwise improper speaker box mounting. Therefore, the exact number, spacing, and location of the coupling mechanisms 18 depends upon the size and shape of the faceplate 16 as there should be a sufficient number to be spaced at reasonable distances about the perimeter of the faceplate 16 to account for warpage or other distortion or irregularity. In the illustrated embodiment, for example, there are shown six independently adjustable coupling mechanisms 18—one at each corner and one midway along each long side, the result being that all coupling mechanisms 18 are spaced equidistant apart, approximately eleven inches, from one another along the faceplate perimeter. In general, optimum spacing will depend upon the nature of the material, size and shape of the faceplate, and the particular application.

Referring primarily to FIGS. 3 and 4, in operation, a hole is cut or otherwise provided in the drywall 26 so as to receive the speaker box 12 and allow the box 12 to be mounted to one or more wall studs 22. The speaker box 12 is mounted substantially flush with the inner surface of the drywall 26. The gasket 14 will already have been coupled with the box 12; the box lip 28 being received within the gasket channel 42. The gasket 16, not being compressed, will protrude outward from the wall 20 approximately one-quarter inch.

The faceplate 14 is then fitted over the box opening 27, such that the male bolts 52 align with the female pylons 30. The bolts 52 are tightened and adjusted independently so as to bring the faceplate 16 into contact with the gasket 14, compressing the gasket 14 and collapsing the air pocket 44 until a substantially uniform degree of separation between faceplate 16 and wallboard 26 is achieved, with the optimum degree of separation being preferably $\frac{1}{32}$ inch, or between $\frac{1}{64}$ inch and $\frac{3}{64}$ inch.

From the preceding description, it can be seen that the speaker enclosure 10 and mounting method of the present invention provide a simple and inexpensive means for suspending or isolating and insulating faceplate 16 and speakers from a mounting wall 20, thereby reducing distortion, vibration, and damage. The faceplate 16 and speakers are suspended or isolated from the wall 20 by the collapsible air pocket 44 which allows the gasket 14 to compress until the faceplate 16 appears to be flush with the wall surface but, in fact, a separation of 1/64 to 3/64 inch remains. Because there is no direct contact between faceplate 16 and wall 20, sound distortion is minimized and damaging speaker vibrations are not transmitted directly to the drywall 26. Furthermore, the faceplate 16 and speakers are insulated from the mounting wall 20 by the rubber gasket which tends to reduce speaker vibrations transmitted from the faceplate 16, to the speaker box 12, and thereafter to the wall studs 22 or other mounting structure.

Although the invention has been described with reference to the preferred embodiment illustrated in the attached drawings, it is noted that equivalents may be employed and substitutions made herein without departing from the scope of the invention as recited in the claims. For example, as described above, the present invention is independent of any particular box-to-stud mounting method, though a preferred method is incorporated by reference. Furthermore, although shown as being mounted within a wall, the enclosure may be mounted beneath any surface or within any structure, such as a ceiling, floor, column, or other structural feature as may be desired and practical.

Having thus described the preferred embodiment of the invention, what is claimed as new and desired to be protected by Letters Patent includes the following:

1. A speaker enclosure comprising:

a speaker box presenting an opening and mountable beneath a surface such that the opening is accessible through the surface;

a compressible gasket affixed to a perimeter of the opening such that the compressible gasket, when uncompressed, protrudes beyond the surface; and a faceplate attachable to the speaker box over the opening by a coupling mechanism, the coupling mechanism being adjustable to cause the faceplate to contact and compress the compressible gasket, leaving a degree of separation between the faceplate and the surface of approximately between 1/64 inch and 3/64 inch.

2. A speaker enclosure comprising:

a speaker box presenting an opening and mountable beneath a surface such that the opening is accessible through the surface a compressible gasket affixed to a perimeter of the opening such that the compressible gasket, when uncompressed, protrudes beyond the surface;

a faceplate attachable to the box over the opening; and a plurality of coupling mechanisms, each being independently adjustable to cause the faceplate to contact and compress the gasket leaving a substantially uniform degree of separation between the faceplate and the surface of approximately between 1/64 inch and 3/64 inch.

3. A method of mounting a speaker enclosure within a surface, the speaker enclosure comprising a speaker box, a gasket, a faceplate and a plurality of independently adjustable coupling mechanism, the method comprising the steps of:

(a) providing a hole in the surface operable to receive the speaker box;

(b) securing the speaker box beneath the surface; and (c) coupling the faceplate to the speaker box by adjusting each independently adjustable coupling mechanism to compress the gasket between the faceplate and the speaker box, leaving a substantially uniform degree of separation between the faceplate and the surface of approximately between 1/64 inch and 3/64 inch.

* * * * *